(12) United States Patent
Myong

(10) Patent No.: US 8,628,995 B2
(45) Date of Patent: Jan. 14, 2014

(54) TANDEM THIN-FILM SILICON SOLAR CELL AND METHOD FOR MANUFACTURING THE SAME

(75) Inventor: Seung-Yeop Myong, Seoul (KR)

(73) Assignee: Intellectual Discovery Co., Ltd., Seoul (KR)

( * ) Notice: Subject to any disclaimer, the term of this patent is extended or adjusted under 35 U.S.C. 154(b) by 0 days.

(21) Appl. No.: 13/308,214

(22) Filed: Nov. 30, 2011

(65) Prior Publication Data

US 2012/0070935 A1    Mar. 22, 2012

Related U.S. Application Data

(62) Division of application No. 12/412,581, filed on Mar. 27, 2009.

(30) Foreign Application Priority Data

May 27, 2008    (KR) ........................ 10-2008-0049000

(51) Int. Cl.
*H01L 21/66* (2006.01)
(52) U.S. Cl.
USPC ................... 438/69; 438/80; 438/96; 438/97; 257/458; 257/464; 257/55; 257/E31.124
(58) Field of Classification Search
USPC ............ 438/69, 80, 56, 96–97; 257/458, 464, 257/55, E31.124, E31.126; 136/244, 256, 136/258–259
See application file for complete search history.

(56) References Cited

U.S. PATENT DOCUMENTS

| 5,824,566 A | 10/1998 | Sano et al. |
| 2002/0066478 A1* | 6/2002 | Hayashi et al. ............... 136/244 |
| 2004/0187913 A1 | 9/2004 | Okada et al. |
| 2005/0229965 A1 | 10/2005 | Nishimura et al. |
| 2009/0133753 A1* | 5/2009 | Sasaki et al. ................. 136/261 |

FOREIGN PATENT DOCUMENTS

| EP | 1650813 | 4/2006 |
| EP | 1650814 | 4/2006 |
| KR | 1020060035751 | 4/2006 |

OTHER PUBLICATIONS

"High Efficiency Protocrystalline Silico/Microcrystalline Silicon Tandem Cell with Zinc Oxide Intermediate Layer," Myong et al., Appl. Phys. Lett. 90, 263509 (2007), pp. 263509-1 to 263509-3.
"A Constructive Combinaton of Antireflection and Intermediate-FReflector Layers for a-Si/uc-Si Thin Film Solar Cells," Das et al., Appl. Phys. Lett. 92, 053509 (2008), pp. 053509-1 to 053509-3.

(Continued)

*Primary Examiner* — Mark A Laurenzi
(74) *Attorney, Agent, or Firm* — H.C. Park & Associates, PLC

(57) ABSTRACT

A tandem thin-film silicon solar cell comprises a transparent substrate, a first unit cell positioned on the transparent substrate, the first unit cell comprising a p-type window layer, an i-type absorber layer and an n-type layer, an intermediate reflection layer positioned on the first unit cell, the intermediate reflection layer including a hydrogenated n-type microcrystalline silicon oxide of which the oxygen concentration is profiled to be gradually increased and a second unit cell positioned on the intermediate reflection layer, the second unit cell comprising a p-type window layer, an i-type absorber layer and an n-type layer.

14 Claims, 5 Drawing Sheets

(56) References Cited

OTHER PUBLICATIONS

P. Buehlmann et al., In situ silicon oxide based intermediate reflector for thin-film silicon micromorph solar cells, Applied Physics Letters 91, 143505-1-3 (2007).

J.K. Rath et al., Effect of oxide treatment at the microcrystalline tunnel junction of a-Si: H/a-Si:H tandem cells, Journal of Non-Crystalline Solids, 266-269, 1129-1133 (2000).

Banerjee et al., Japanese Journal of applied Physics, vol. 41 (2202), Part 2, No. 7A, Jul. 1, 2002 (pp. L787-L789).

* cited by examiner

TANDEM THIN-FILM SILICON SOLAR CELL AND METHOD FOR MANUFACTURING THE SAME

CROSS-REFERENCE TO RELATED APPLICATIONS

The present application is a divisional of U.S. patent application Ser. No. 12/412,581, filed Mar. 27, 2009, which in turn claims priority to Korean Patent Application No 10-2008-0049000, filed May 27, 2008, the entireties of which are hereby incorporated by reference.

FIELD OF THE INVENTION

The present embodiment relates to a tandem thin-film silicon solar cell and a method for manufacturing the same.

Recently, energy has become the most serious problem that impacts on human's future life due to the high oil price and the global warming caused by an excessive emission of CO2. Many technologies for renewable energy have been developed, such as wind power generation, bio-energy, hydrogen fuel cells and the like. However, solar energy is almost infinite and clean energy as the origin of all energies, and hence solar cells using sunlight have become into the spotlight.

The power of sunlight incident on the surface of the earth is 120,000 TW. Theoretically, if only 0.16% of the surface area of land on the earth is covered with solar cells having a conversion efficiency of 10%, the solar cell can generate power of 20 TW per year, which is two times greater than global energy consumption.

Practically, the global solar cell market was explosively developed with all annual growth rate of 40% during the past 10 years. Currently, 90% of the solar cell market is shared by bulk silicon solar cells such as single-crystalline silicon solar cells or multi-crystalline silicon solar cells. However, production of solar-grade silicon wafer which is a main source does not catch up with explosive demand, and the solar-grade silicon wafer is running short all over the world. Therefore, the solar-grade silicon wafer is a crucial factor in lowering production cost.

On the other hand, thin-film silicon solar cells using a absorber based on hydrogenated amorphous silicon (a-Si:H) can reduce the thickness of silicon to less than $1/100$ of that of silicon used in the bulk silicon solar cells. Further, it is possible to produce large-size and low-cost thin-film silicon solar cells.

However, the so-called Staebler-Wronski effect is blocking the commercialization of the thin-film silicon solar cells. The Staebler-Wronski effect refers to degradation caused by the photocreation of dangling bond accompanied by non-radiative recombination of electron-hole pairs photogenerated in an absorber based on amorphous silicon when light is irradiated onto a thin-film silicon solar cell.

A large number of studies were conducted during the past thirty years to reduce light-induced degradation of an amorphous silicon-based intrinsic abosorber. As a result, it has been found that kinds of two edge materials at a phase boundary between amorphous silicon and microcrystalline silicon are good intrinsic absorbers with a low light-induced degradation ratio. One is hydrogenated intrinsic protocrystalline silicon (i-pc-Si:H) which exists just before the amorphous silicon to microcrystalline silicon transition. The other is hydrogenated intrinsic microcrystalline silicon (i-pc-Si:H) having a crystal volume fraction of 30 to 50%.

Meanwhile, although the degradation against light soaking is reduced, there is a limit to performance achieved by single-junction thin-film silicon solar cells. For this reason, to obtain high stabilized efficiency, there have been developed a double-junction thin-film silicon solar cell in which a top cell based on amorphous silicon is stacked on a bottom cell based on microcrystalline silicon and a triple-junction thin-film silicon solar cell more developed from the double-junction thin-film silicon solar cell.

The double-junction or triple-junction thin-film silicon solar cell is referred to as a tandem solar cell. The open-circuit voltage of the tandem solar cell is the sum of voltages of respective unit cells, and the short-circuit current of the tandem solar cell is the minimum current among short-circuit currents of the respective unit cells.

In a tandem solar cell which comprises a top cell and a bottom cell forming heterojunction, the optical band gap of an intrinsic absorber is gradually decreased as light is incident from the top cell to the bottom cell. Accordingly, light with a wide range of spectrum is absorbed into the respective unit cell by separating light, so that quantum efficiency can be enhanced.

Further, the thickness of an intrinsic absorber of the top cell based on amorphous silicon having relatively serious degradation caused by light soaking can be decreased, so that a degradation ratio can be reduced, and accordingly, a highly stabilized efficiency can be obtained.

The stability of the tandem solar cell against light soaking is influenced by the stability of an intrinsic absorber of each of the unit cells, against light soaking and the thickness of an intrinsic absorber of the top cell sensitive to light soaking.

Therefore, an intermediate reflection layer capable of strengthening internal reflection is interposed between a top cell and a bottom cell in a double-junction thin-film silicon solar cell or between a top cell and a middle cell in a triple-junction thin-film silicon solar cell, so that the thickness of a absorber based on hydrogenated intrinsic amorphous silicon is decreased in the top cell sensitive to light soaking, and desired short-circuit current is maintained and improved. Accordingly, a degradation ratio can be reduced, and a highly stabilized efficiency can be obtained.

At this time, the intermediate reflection layer of the tandem solar cell requires a transparent material which has a small light absorption, a high electric conductivity and a large difference of refractive indices between the intermediate reflection layer and a silicon thin-film.

Since the refractive index of the silicon thin-film is 3.5 to 4.0, a material having a refractive index smaller than that of the silicon thin-film has been developed as the intermediate reflection layer. The material is a zinc oxide (ZnO) thin-film having a refractive index of around 1.9 (S. Y. Myong et al., Applied Physics Letters, 2007, Vol. 90, p. 3026-3028, Y. Akano et al., EP 1650814A1, Y. Akano et al., EP1650813A1) or a hydrogenated n-type mixed-phase silicon oxide (n-SiOx:H) thin-film having a refractive index of around 2.0 (C. Das et al., Applied Physics Letters, 2008, Vol. 92, p. 053509, P. Buchlmann et al., Applied Physics Letters, 2007, Vol. 91, p. 143505).

Here, the mixed phase refers to a structure in which crystalline silicon grains are incorporated into the tissue of a hydrogenated amorphous silicon oxide (a-SiOx:H), and is frequently referred to as nanocrystalline or microcrystalline.

On the Ramam spectrum of a thin-film, a transverse optic (TO) mode crystalline silicon peak exists near 520 nm.

The zinc oxide intermediate reflection layer has excellent transmittance and vertical electric conductivity, so that the efficiency of the tandem solar cell can be improved. However, in mass production of large-area solar cells, problems such as shunts are generated in zinc oxide when the zinc oxide intermediate reflection layer is patterned through laser scribing.

Since the hydrogenated n-type mixed-phase silicon oxide thin-film is a kind of silicon alloy, laser patterning can be simultaneously performed with respect to top and bottom cells using the same laser wavelength. Accordingly, the mass production yield of the solar cell can be increased, and the layout of mass production lines can be simplified. As the content of oxygen is increased, the refractive index is decreased, and thus the internal reflection is increased. However, the crystal volume fraction is decreased, and the electric conductivity is lowered. Therefore, the series resistance is increased, and the fill factor (FF) is decreased.

SUMMARY OF THE INVENTION

In one aspect, a tandem thin-film silicon solar cell comprises a transparent substrate, a first unit cell positioned on the transparent substrate, the first unit cell comprising a p-type window layer, an i-type absorber layer and an n-type layer, an intermediate reflection layer positioned on the first unit cell, the intermediate reflection layer including a hydrogenated n-type microcrystalline silicon oxide of which the oxygen concentration is profiled to be gradually increased and a second unit cell positioned on the intermediate reflection layer, the second unit cell comprising a p-type window layer, an i-type absorber layer and an n-type layer.

The intermediate reflection layer may have a thickness of 10 to 100 nm.

The intermediate reflection layer may have a refractive index of around 2.0.

The intermediate reflection layer may have a resistivity of $10^2$ to $10^5$ $\Omega$cm.

The n-type layer of the first unit cell may include hydrogenated n-type microcrystalline silicon.

The first unit cell may include hydrogenated amorphous silicon.

The second unit cell may include hydrogenated amorphous silicon or hydrogenated microcrystalline silicon.

The solar cell may comprise two or three unit cells.

In one aspect, a method for manufacturing a tandem thin-film silicon solar cell comprises coating a transparent front electrode layer on a transparent substrate, removing a portion of the transparent front electrode layer to form a separation trench using a first patterning process, thereby forming a plurality of transparent front electrodes, forming a first unit cell layer on the plurality of transparent front electrodes and in the separation trench, the first unit cell layer comprising a p-type window layer, an i-type absorber layer and an n-type layer, forming an intermediate reflection layer on the first unit cell layer or forming an intermediate reflection layer by oxidizing the first unit cell layer, the intermediated reflective layer including a hydrogenated n-type microcrystalline silicon oxide of which an oxygen concentration is profiled to be gradually increased, forming a second unit cell layer on the intermediate reflection layer, removing portions of the first and second unit cell layers to form a separation trench using a second patterning process, stacking a metal rear electrode layer on the second unit cell layer and in the separation trench formed using the second patterning process and removing a portion of the metal rear electrode layer to forming a separation trench using a third patterning process.

When the intermediate reflection layer is formed by oxidizing the first unit cell layer, an oxygen source gas for forming the intermediate reflection layer may include carbon dioxide or oxygen.

The intermediate reflection layer may have a refractive index of around 2.0.

The intermediate reflection layer may have a thickness of 10 to 100 nm.

The intermediate reflection layer may have a specific resistivity of $10^2$ to $10^5$ $\Omega$cm.

Two or three unit cell layers may be formed.

When the intermediate reflection layer is formed on the first unit cell layer, the n-type layer of the first unit cell layer may have a thickness of 30 to 50 nm and includes hydrogenated n-type microcrystalline silicon.

When the intermediate reflection layer is formed by oxidizing the n-type layer of the first unit cell layer, the n-type layer of the first unit cell layer may have a thickness of 40 to 150 nm and includes hydrogenated n-type microcrystalline silicon.

When the intermediate reflection layer is formed on the first unit cell layer, the deposition temperature and deposition pressure for stacking the n-type of the first unit cell layer may be maintained.

The n-type layer of the first unit cell layer and the intermediate reflection layer may be formed in the same reaction chamber.

When the intermediate reflection layer is formed on the first unit cell layer, the pressure fraction of the oxygen source gas for forming the intermediate reflection layer may be increased and then maintained constant, or the flow of the oxygen source gas is increased through multiple steps.

When the intermediate reflection layer is formed by oxidizing the first unit cell layer, plasma for forming the n-type layer of the first unit cell layer is turned off, the oxygen source layer for forming the intermediate reflection layer may be introduced, and the plasma may be then turned on.

DETAILED DESCRIPTION

Reference will now be made in detail embodiments of the invention examples of which are illustrated in the accompanying drawings.

Tandem thin-film silicon solar cell has a double-junction structure or a triple-junction structure. However, a tandem thin-film silicon solar cell having a double-junction structure will be described as an example in FIG. 1.

Figure 1:
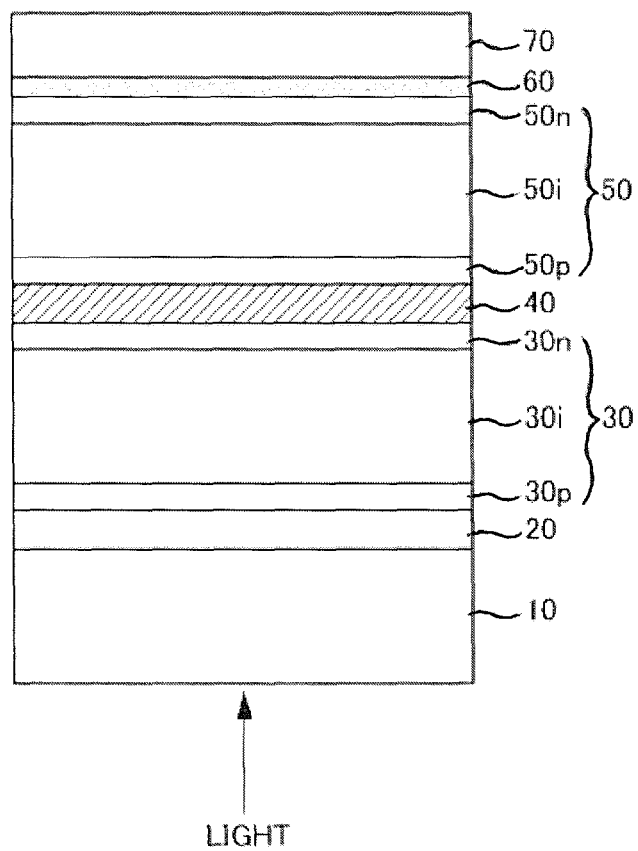
FIG. 1 is a cross-sectional view illustrating the structure of a tandem thin-film silicon solar cell according to an embodiment.

As illustrated in FIG. 1, a tandem thin-film silicon solar cell according to an embodiment comprises a transparent insulating substrate 10, a transparent front electrode 20, a first unit cell 30, an intermediate reflection layer 40, a second unit cell 50 and a metal rear electrode 70.

The transparent front electrode 20 is formed on the transparent insulating substrate 10 and includes a transparent conducting oxide (TCO).

The first unit cell 30 are positioned on the transparent insulating substrate 10 and the transparent front electrode 20 and comprises a p-type window layer 30p, an i-type absorber layer 30*i* and an n-type layer 30*n*, which are formed using a plasma enhanced chemical vapor deposition (CVD) technique.

The intermediate reflection layer 40 is positioned on the first unit cell 30 and includes a hydrogenated n-type microcrystalline silicon oxide. At this time, an oxyzon concentration of the intermediate reflection layer 40 is profiled to be gradually increased.

The second unit cell 50 is positioned on the intermediate reflection layer 40 and comprises a p-type window layer, an i-type absorber layer 50*i* and an n-type layer 50*n*, which are formed using a PECVD technique. The second unit cell 50 may comprise hydrogenated amorphous silicon or hydrogenated microcrystalline silicon.

The metal rear electrode 70 is stacked on the second unit cell 50.

As illustrated in FIG. 1, the tandem thin-film silicon solar cell according to the embodiment may further comprise a back reflection layer 60 grown using a CVD technique so as to maximize the light trapping effect between the n-type layer 50*n* of the second unit cell 50 and the metal rear electrode 70.

In the tandem thin-film silicon solar cell, the transparent insulating substrate 10 is a portion to which light is primarily incident and has excellent transmittance of light. The transparent insulating substrate 10 may include a transparent insulative material to prevent an internal short circuit in the thin-film silicon solar cell.

The transparent front electrode 20 allows incident light to be scattered in various directions and has durability for hydrogen plasma used to form a microcrystalline silicon thin-film. Accordingly, the transparent front electrode 20 may include zinc oxide (ZnO).

In the embodiment, the first unit cell 30 comprising the p-type window layer 30*p*, the i-type absorber layer and the n-type layer 30*n* is formed by a radio frequency plasma enhanced chemical vapor deposition (RF PECVD) technique using a frequency of 13.56 MHz or a very high frequency (VHF) PECVD technique using a higher frequency than 13.56 MHz. With the increase in the plasma excitation frequency, the deposition speed is increased, and the quality of layers is improved. At this time, the first unit cell 30 may include hydrogenated amorphous silicon.

The intermediate reflection layer 40 includes a oxygen-profiled hydrogenated n-type microcrystalline silicon oxide or a hydrogenated n-type microcrystalline silicon oxide formed using a subsequent oxidizing process. The intermediate reflection layer 40 is formed on the hydrogenated n-type microcrystalline silicon (n-[mu]c-Si:H) thin-film 30*n*.

The second unit cell 50 may be formed on the intermediate reflection layer 40 using an RF or VHF PECVD technique. The second unit cell 50 comprises a p-type window layer 50*p*, an i-type absorber layer 50*i* and an n-type layer 50*n*. At this time, the second unit cell 50 is based on microcrystalline silicon or amorphous silicon.

The back reflection layer 60 is deposited on the n-type layer 50*n* of the second unit cell 50 using a CVD technique and includes zinc oxide (ZnO) so as to maximize the light trapping effect between the n-type layer 50*n* of the second unit cell 50 and the metal rear electrode 70.

The metal rear electrode 70 serves as a rear electrode which reflects light transmitted into the second unit cell 50. The metal rear electrode 70 may include zinc oxide (ZnO) or silver (Ag). The metal rear electrode 70 may be grown using a CVD or sputtering technique.

For serial connection in the mass production of thin-film silicon solar cells, a patterning process is performed using a pattern forming method such as laser scribing. Such a patterning process is performed on the transparent front electrode 20, the second unit cell 50 and the metal rear electrode 70.

Figure 2A:
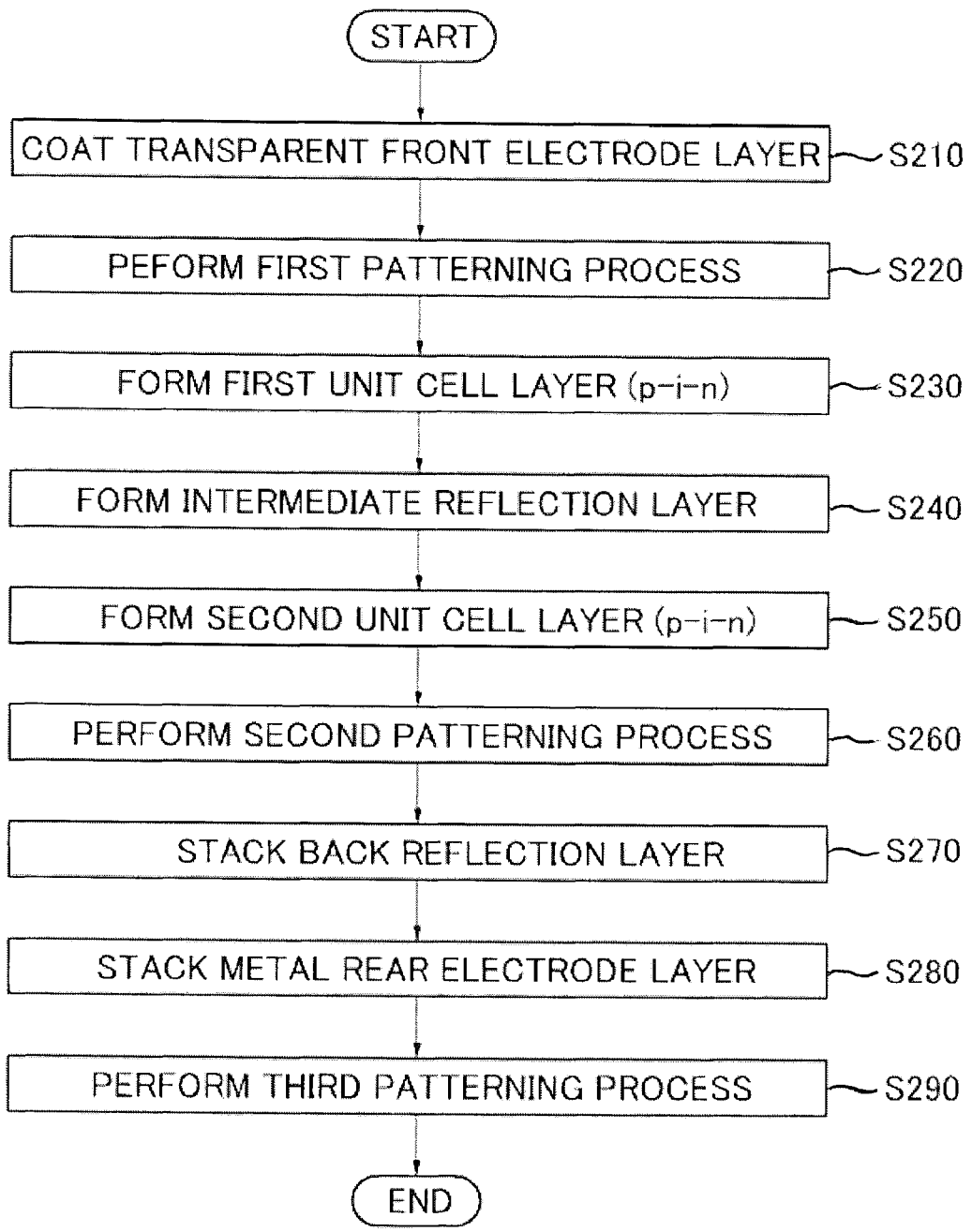
FIGS. 2a and 2b are flowcharts illustrating a method for manufacturing a tandem thin-film silicon solar cell according to an embodiment.
Figure 2B:
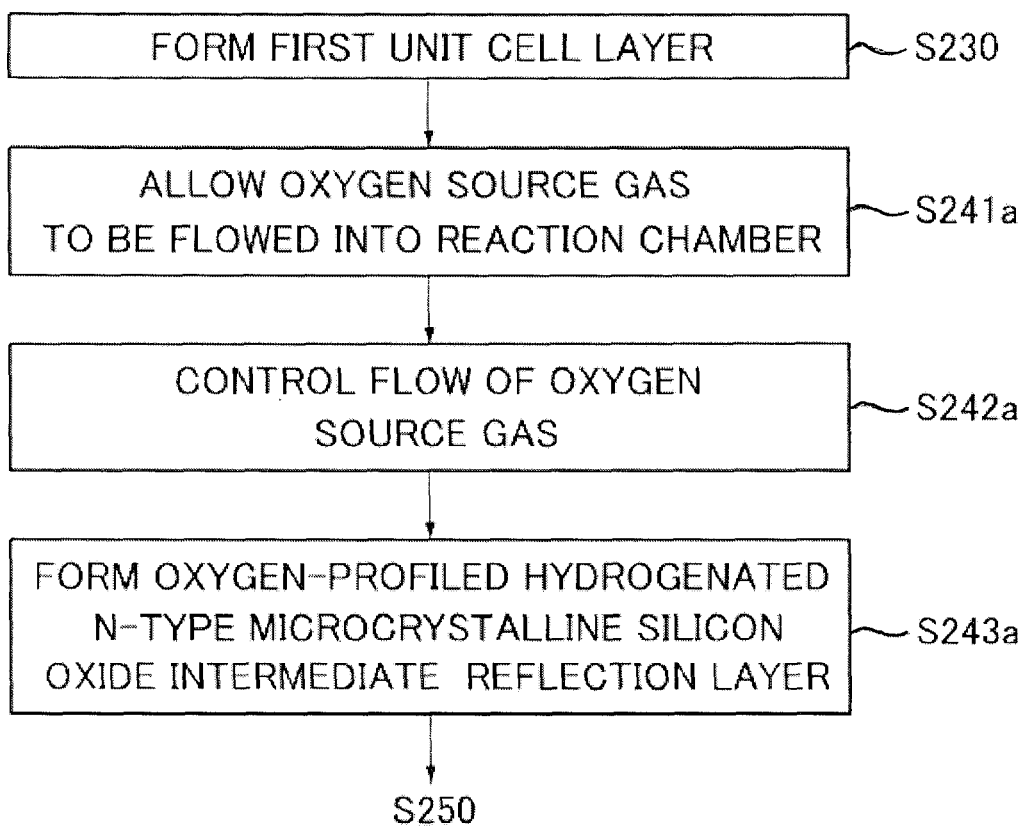

Hereinafter, a method for forming an intermediate reflection layer will be described in detail with reference to FIGS. 2*a*, 2*b*, 3*a* and 3*b*. FIGS. 2*a* and 2*b* are flowcharts illustrating a method for manufacturing a tandem thin-film silicon solar cell according to an embodiment.

As illustrated in FIG. 2*a*, a transparent front electrode layer is coated on a transparent insulating substrate 10 (S210).

A portion of the transparent front electrode layer coated on the transparent insulating substrate 10 is removed to form a separation trench using a first patterning process, thereby forming a plurality of transparent front electrodes 20 spaced apart from each other (S220).

A first unit cell layer is formed in the separation trench formed between the plurality of transparent front electrodes 20 and is formed on the transparent front electrode 20 (S230). Here, the first unit cell layer comprises a p-type window layer 30*p*, an i-type absorber layer 30*i* and an n-type layer 30*n*.

An intermediate reflection layer 40 including a hydrogenated n-type microcrystalline silicon oxide (n-[mu]c-SiOx:H) is formed on the first unit cell layer (S240). By controlling the flow of carbon dioxide introduced into a chamber, an oxygen concentration of the intermediate reflection layer 40 is profiled to be gradually increased.

A second unit cell layer is formed on the intermediate reflection layer 40 (S250). Here, the second unit cell layer comprises a p-type window layer 50*p*, an i-type absorber layer 50*i* and an n-type layer 50*n*.

Portions of the first and second unit cell layers are removed to form a separation trench using a second patterning process, thereby firming first and second unit cells 30 and 50 (S260).

A metal rear electrode layer is stacked on the second unit cell 50 and is stacked in the separation trench formed using the second patterning process (S280). Accordingly, the metal rear electrode layer is connected to the transparent front electrode 20.

A portion of the metal rear electrode layer is removed to form a separation trench using a third patterning process, thereby forming a plurality of metal rear electrodes 70 (S290).

To maximize the light trapping effect after the second patterning process, a back reflection layer 60 may be formed on the n-type layer 50*n* of the second unit cell layer using a CVD technique (S270).

To improve an initial efficiency, a buffer layer may be interposed between the p-type window layer 30*p* and the i-type absorber layer 30*i* in the forming of the first unit cell layer (S230). The initial efficiency refers to the efficiency of the solar cell before light soaking according to the embodiment.

In the forming of the first unit cell layer (S230), the first unit cell layer comprising p-i-n-type thin-film silicon is formed using an RF or VHF PECVD technique. The n-type layer 30*n* of the first unit cell layer has a thickness of 30 to 50 nm and comprises a hydrogenated n-type microcrystalline silicon (n-$\mu$c-Si:H) thin-film. When the n-type layer 30*n* of the first unit cell layer has a thickness of 30 nm or thicker, the n-type layer 30*n* has high electrical conductivity. When the n-type layer 30*n* of the first unit cell layer has a thickness of 50 nm or thinner, excessive light absorption due to the increase of thickness is prevented.

At this time, a source gas for forming the hydrogenated n-type microcrystalline silicon (n-$\mu$c-Si:H) thin-film may include silane ($SiH_4$), hydrogen ($H_2$) and phosphine ($PH_3$).

After the n-type layer 30n comprising the hydrogenated n-type microcrystalline silicon (n-μc-Si:H) thin-film is formed, an oxygen source gas such as carbon dioxide (CO2) is introduced into a reaction chamber (S241a) while maintaining a flow rate of the source gas, deposition temperature and deposition pressure as illustrated in FIG. 2B. Since the flow rate of the source gas, the deposition temperature and the deposition pressure are maintained and a mixed gas containing the source gas and the oxygen source gas is introduced into the reaction chamber, the n-type layer 30n of the first unit cell layer and the intermediate reflection layer 40 may be formed in the same reaction chamber.

At this time, the flow rate of the oxygen source gas is controlled by a mass flow controller (MFC) (S242a). That is, when the mixed gas in the reaction chamber is set to have a predetermined flow rate, the MFC may control the pressure fraction of the oxygen source gas in the mixed gas to be increased and then maintained constant. Accordingly, the oxygen-profiled intermediate reflection layer 40 is formed on the first unit cell layer (S243a).

The intermediate reflection layer 40 includes a hydrogenated n-type microcrystalline silicon oxide (n-μc-SiOx:H), and an oxygen concentration of the hydrogenated n-type microcrystalline silicon oxide (n-μc-SiOx:H) is profiled to be gradually increased. For example, when a distance between a first position of the inside of the hydrogenated n-type microcrystalline silicon oxide (n-μc-SiOx:H) and the transparent insulating substrate 10 is greater than a distance between a second position of the inside of the hydrogenated n-type microcrystalline silicon oxide (n-μc-SiOx:H) and the transparent insulating substrate 10, an oxygen concentration at the first position is greater than an oxygen concentration at the second position.

The MFC allows the flow rate of the oxygen source gas to be increased through multi-steps (S242a), thereby forming the intermediate reflection layer 40 including a hydrogenated n-type microcrystalline silicon oxide (n-μc-SiOx:H) (S243a). Accordingly, the oxygen concentration of the hydrogenated n-type microcrystalline silicon oxide (n-μc-SiOx:H) is profiled to be gradually increased.

The thickness of the intermediate reflection layer 40 may be 10 to 100 nm. When the thickness of the intermediate reflection layer 40 is 10 nm or thicker, the internal reflection of light can be sufficiently performed. When the thickness of the intermediate reflection layer 40 is 100 nm or thinner, light can be sufficiently supplied from the first unit cell 30 to the second unit cell 50, and it is possible to prevent light absorption caused by the intermediate reflection layer 40 and to prevent unnecessary increase in series resistance between the first and second unit cells 30 and 50.

In the embodiment, the intermediate reflection layer 40 may have a resistivity of $10^2$ to $10^5$ Ωcm and a refractive index of around 2.0. Accordingly, the intermediate reflection layer 40 has a high vertical electrical conductivity.

Therefore, since the rapid lowering of the crystal volume fraction is prevented, the degradation of a vertical electrical conductivity is prevented. A refractive index or optical band gap is not discontinuously changed but is continuously changed at the boundary between the n-type layer 30n of the first unit cell layer and the intermediate reflection layer 40.

Accordingly, it is possible to prevent the detect density at the heterogeneous boundary between the n-type layer 30n of the first unit cell layer and the intermediate reflection layer 40 from being rapidly increased, and light absorption caused by the intermediate reflection layer 40 can be minimized.

Figure 3A:
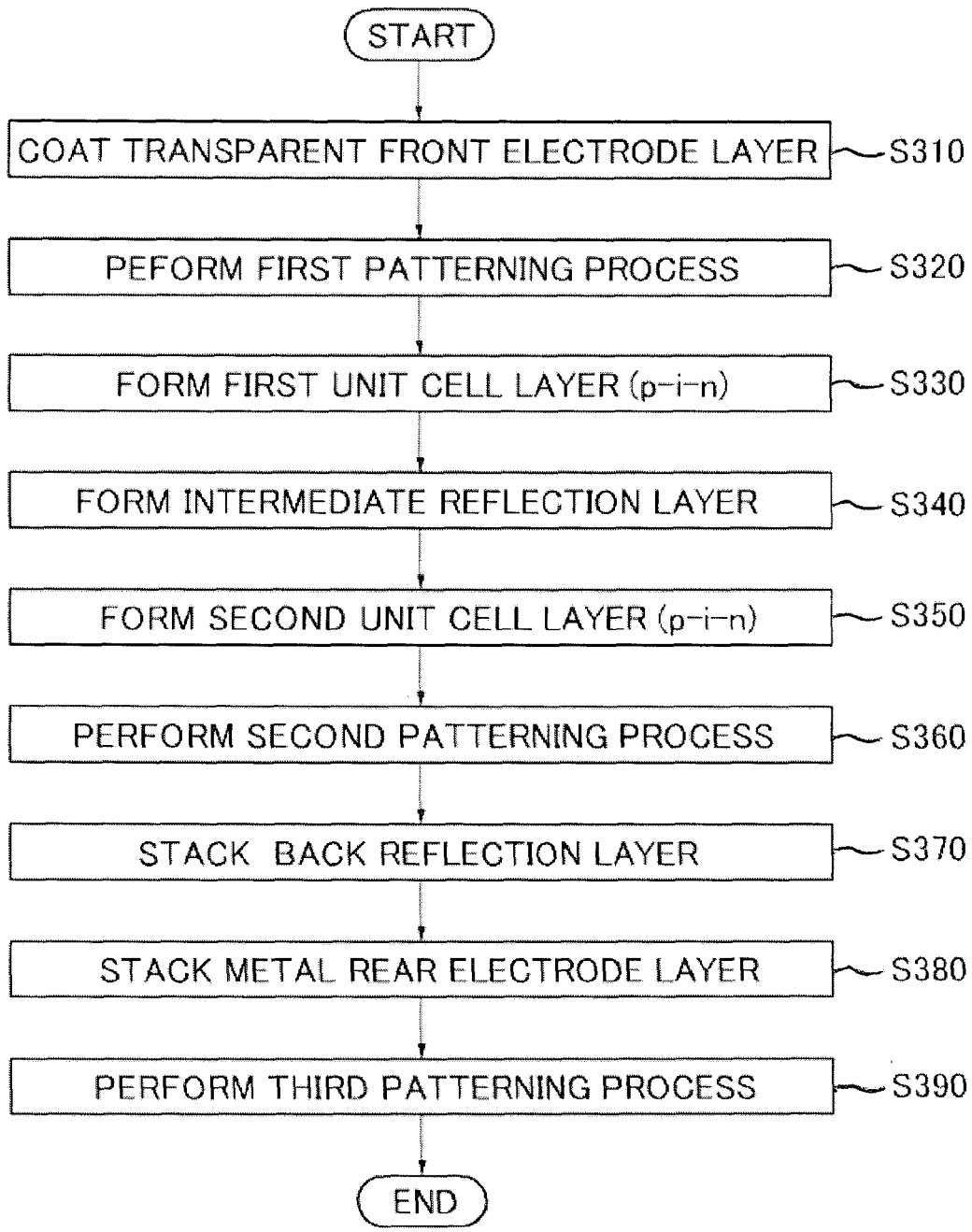
FIGS. 3a and 3b are flowcharts illustrating a method for manufacturing a tandem thin-film silicon solar cell according to another embodiment.
Figure 3B:
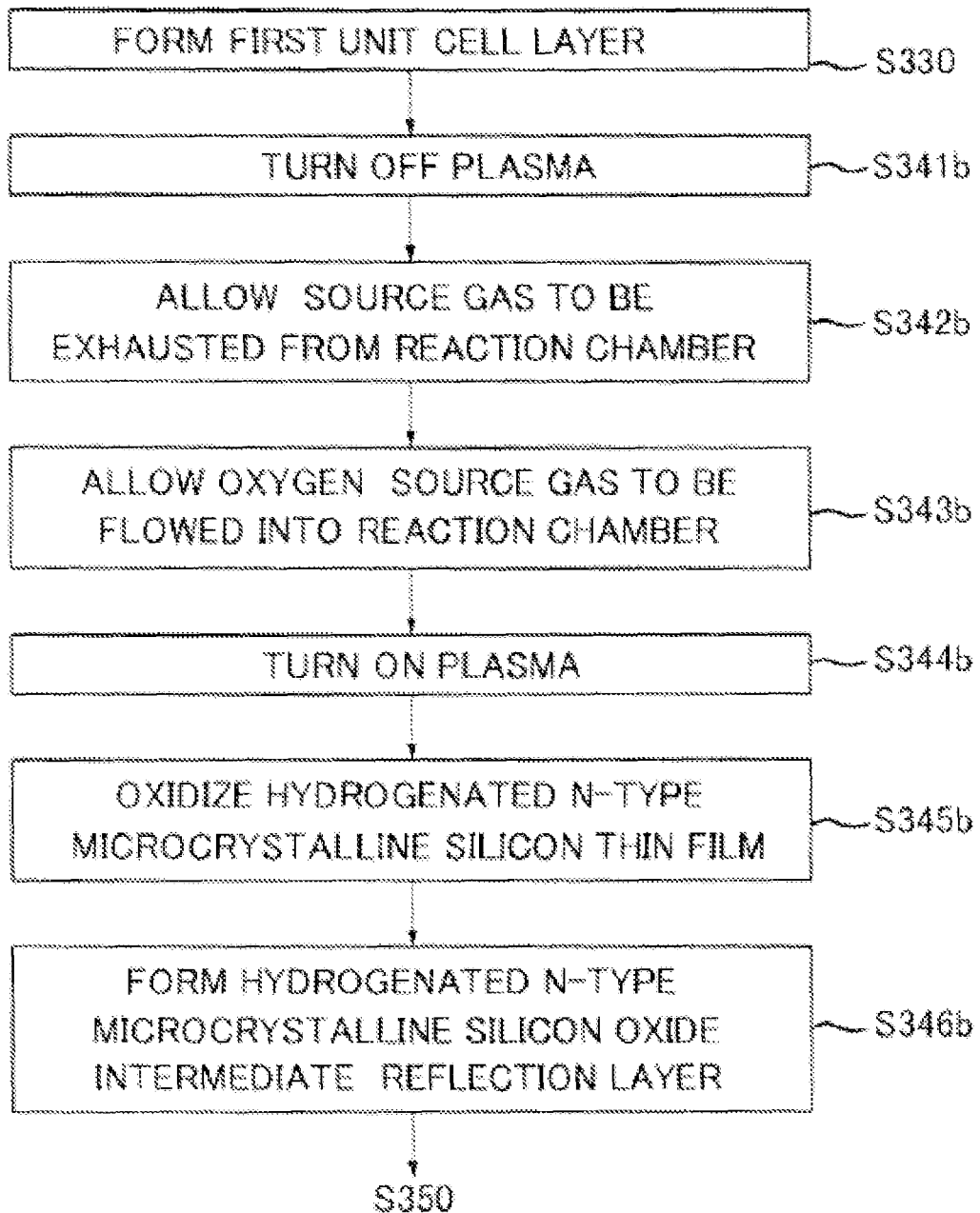

FIGS. 3a and 3b are flowcharts illustrating a method for manufacturing a tandem thin-film silicon solar cell according to another embodiment.

As illustrated in FIG. 3a, a transparent front electrode layer is coated on a transparent insulating substrate 10 (S310).

A portion of the transparent front layer is removed to form a Separation trench using a first patterning process, thereby forming a plurality of transparent front electrodes 20 (S320).

A first unit cell layer is formed on the transparent front electrode 20, and is formed in the separation trench formed by the first patterning process (S330). Here, the first unit cell layer comprises a p-type window layer 30p, an i-type absorber layer 30i and an n-type layer 30n.

Oxygen atoms are decomposed from an oxygen source gas such as oxygen or carbon dioxide by plasma, and the oxygen atoms are diffused into microcrystalline silicon (n-[mu]c-Si:H) of the n-type layer 30n, thereby forming an intermediate reflection layer 40 including a hydrogenated n-type microcrystalline silicon oxide (n-μc-SiOx:H) (S340). That is, in another embodiment, the intermediate reflection layer 40 is formed by oxidizing the n-type layer 30n of the first unit cell layer.

A second unit cell layer is formed on the intermediate reflection layer 40 (S350). Here, the second unit cell layer comprises a p-type window layer 50p, an i-type absorber layer 50i and an n-type layer 50n.

Portions of the first unit cell layer, the intermediate reflection layer 40 and the second unit cell layers are removed to form a separation trench using a second patterning process, thereby forming first and second unit cells 30 and 50 (S360).

A metal rear electrode layer is stacked on the second unit cell 50 and in the separation trench formed using the second patterning process (S380). Accordingly, the metal rear electrode layer is connected to the transparent front electrode 20.

A portion of the metal rear electrode layer is removed to forming a separation trench using a third patterning process, thereby forming a plurality of metal rear electrodes 70 (S390).

To maximize the light trapping effect after the second patterning process, a back reflection layer 60 may be formed on the n-type layer 50n of the second unit cell layer using a CVD technique (S370).

To improve an initial efficiency, a buffer layer may be interposed between the p-type window layer 30p and the i-type absorber layer 30i during the formation of the first unit cell layer (S330).

When the first unit cell layer is formed using an RF or VHF PECVD technique (S330), the n-type layer 30n of the first unit cell layer may have a thickness of 40 to 150 nm and comprises a hydrogenated n-type microcrystalline silicon (n-μc-Si:H) thin-film. At this time, a source gas for the formation of the n-type layer 30n of the first unit cell layer may include silane ($SiH_4$), hydrogen ($H_2$) and phosphine ($PH_3$).

Meanwhile, as illustrated in FIG. 3b, an end of the deposition of the hydrogenated n-type microcrystalline silicon (n-μc-Si:H) thin-film is performed by the turn-off of plasma (S341b), i.e., the end of plasma production. After the deposition of the hydrogenated n-type microcrystalline silicon (n-μc-Si:H) thin-film is ended, the three source gases are exhausted from the reaction chamber while maintaining the deposition temperature (S342b).

After the source gases are exhausted, the post-process base pressure in the reaction chamber may be $10^{-5}$ to $10^{-7}$ Torr. After the pressure in the reaction chamber reaches the post-process base pressure, an oxygen source gas such as oxygen ($O_2$) or carbon dioxide (CO2) is introduced into the reaction chamber (S343b). The post-process pressure in the reaction chamber is maintained constant by a pressure controller and an angle valve, which are connected to the reaction chamber.

At this time, a flow rate of the oxygen source gas introduced into the reaction chamber may be (0 to 500 sccm, and the pressure in the reaction chamber may be 0.5 Torr. If the flow rate of the oxygen source gas is 10 sccm or more, the oxygen diffusion speed is increased. If the flow rate of the oxygen source gas is 500 sccm or less, the unnecessary increase of gas cost is prevented. When the pressure in the reaction chamber is 0.5 Torr, an appropriate oxygen diffusion speed is secured, and the increase of gas cost is prevented.

Thereafter, the oxygen source gas is decomposed by turning on plasma (S344b), i.e., by generating plasma, and oxygen atoms are produced. If the surface of the hydrogenated n-type microcrystalline silicon (n-μc-Si:H) thin-film of the n-type layer 30n is oxidized by the oxygen atoms (S345b), an intermediate reflection layer 40 comprising a hydrogenated n-type microcrystalline silicon oxide (n-μc-SiOx:H) thin-film is formed on the hydrogenated n-type microcrystalline silicon (n μc-Si:H) thin-film of the n-type layer 30n (S346b).

After the oxidizing process is ended by controlling a time of the oxidizing process, the thickness of the hydrogenated n-type microcrystalline silicon (n-μc-Si:H) thin-film is decreased to 30 to 50 nm. As the thickness of the hydrogenated n-type microcrystalline silicon (n-μc-Si:H) thin-film is increased, the crystal volume fraction is increased and the vertical electrical conductivity is also increased. In another embodiment, the hydrogenated n-type microcrystalline silicon (n-μc-Si:H) thin-film having high crystal volume fraction is easily post-oxidized by penetrating oxygen into a grain boundary thereof.

The surface of the hydrogenated n-type microcrystalline silicon (n-μc-Si:H) thin-film is converted into the intermediate reflection layer 40 comprising hydrogenated n-type microcrystalline silicon oxide (n-μc-SiOx:H) thin-film through the post-oxidation process. Accordingly, the rapid lowering of the vertical electrical conductivity is prevented, and the refractive index is decreased.

As illustrated in FIGS. 2a to 3b, in the methods of manufacturing a tandem thin-film silicon solar cell according to the embodiments, the first to third patterning processes for serial connection are performed using techniques such as laser scribing.

Accordingly, to form a large-area solar cell, the respective unit cells and the intermediate reflection layer are simultaneously patterned using laser with the same wavelength, so that the production yield of the tandem thin-film silicon solar cell is increased, and the layout of mass production lines can be simplified.

In the present embodiments, the p-type window layers 30p and 50p are layers doped with an impurity such as a group III element, and the i-type absorber layers 30i and 50i are intrinsic silicon layers. The n-type layers 30n and 50n are layers doped with an impurity such as a group V element.

Meanwhile, in the tandem thin-Film silicon solar cell and the method For manufacturing the same according to the present embodiments, a p-i-n-p-i-n-type double-junction thin-film silicon solar cell having a plurality of and a p-i-n-p-i-n-p-i-n-type triple junction thin-film silicon solar cell will be described.

As aforementioned, in the p-i-n-p-i-n-type double-junction thin-film silicon solar cell, an intermediate reflection layer 40 including a hydrogenated n-type microcrystalline silicon oxide (n-μc-SiOx:H) with a refractive index of around 2.0 is formed between first and second unit cells.

In the double-junction thin-film silicon solar cell, an i-type absorber layer of the first unit cell may include any one of hydrogenated intrinsic amorphous silicon (i-a-Si:H), hydrogenated intrinsic protocrystalline silicon (i-pc-Si:H), hydrogenated intrinsic protocrystalline silicon multilayer (i-pc-Si:H multilayer), hydrogenated intrinsic amorphous silicon carbide (i-a-SiC:H), hydrogenated intrinsic protocrystalline silicon carbide (i-pc-SiC:H), hydrogenated intrinsic protocrystalline silicon carbide multilayer (i-pc-SiC:H multilayer), hydrogenated intrinsic amorphous silicon oxide (i-a-SiO:H), hydrogenated intrinsic protocrystalline silicon oxide (i-pc-SiO:H) or hydrogenated intrinsic protocrystalline silicon oxide multilayer multilayer).

In the double-junction thin-film silicon solar cell, an i-type absorber layer of the second unit cell may include any one of hydrogenated intrinsic amorphous silicon (i-a-Si:H), hydrogenated intrinsic amorphous silicon germanium (i-a-SiGe:H), hydrogenated intrinsic protocrystalline silicon germanium (i-pc-SiGe:H), hydrogenated intrinsic nanocrystalline silicon (i-nc-Si:H), hydrogenated intrinsic microcrystalline silicon (i-pc-Si:H) or hydrogenated intrinsic microcrystalline silicon germanium (i-pc-SiGe:H).

Meanwhile, in the p-i-n-p-i-n-p-i-n-type triple-junction thin-film silicon solar cell, a unit cell (hereinafter a middle cell) positioned in the middle of three unit cells may correspond to the first or second unit cell explained in the present embodiments.

When the middle cell is the first unit cell, the second unit cell is positioned in contact with or adjacent to a metal rear electrode of the triple-junction thin-film silicon solar cell. When the middle cell is the second unit cell, the first unit cell is positioned in contact with or adjacent to a transparent front electrode of the triple-junction thin-film silicon solar cell.

Further, when the middle cell is the second unit cell, an intermediate reflection layer including a hydrogenated n-type microcrystalline silicon oxide (n-μc-SiOx:H) is formed between the first and second unit cells.

Furthermore, an intermediate reflection layers including a hydrogenated n-type microcrystalline silicon oxide (n-μc-SiOx:H) with a refractive index of around 2.0 may be formed between every two adjacent unit cells of the three unit cells.

In the triple-junction thin-film silicon solar cell, an i-type absorber layer of the unit cell in contact with or adjacent to the transparent front electrode may include any one of hydrogenated intrinsic amorphous silicon (i-a-Si:H), hydrogenated intrinsic protocrystalline silicon (i-pc-Si:H), hydrogenated intrinsic protocrystalline multilayer (I-pc-Si:H multilayer), hydrogenated intrinsic amorphous silicon carbide (i-a-SiC:H), hydrogenated intrinsic protocrystalline silicon carbide (i-pc-SiC:H), hydrogenated intrinsic protocrystalline silicon carbide multilayer (i-pc-SiC:H multilayer), hydrogenated intrinsic amorphous silicon oxide (i-a-SiO:H), hydrogenated intrinsic protocrystalline silicon oxide (i-pc-SiO:H) or hydrogenated intrinsic protocrystalline silicon oxide multilayer (i-pc SiO:H multilayer).

In the triple-junction thin-film silicon solar cell, an i-type absorber layer of the middle may include any one of hydrogenated intrinsic amorphous silicon germanium (i-a-SiGe:H), hydrogenated intrinsic protocrystalline silicon germanium (i-pc-SiGe:H), hydrogenated intrinsic nanocrystalline silicon (i-nc-Si:H), hydrogenated intrinsic microcrystalline silicon (i-pc-Si:H) or hydrogenated intrinsic microcrystalline silicon germanium carbon (i-[mu]c-SiGeC:H). An intrinsic absorber of the bottom cell may include any one of hydrogenated intrinsic amorphous silicon germanium (i-a-SiGe:H), hydrogenated intrinsic protocrystalline silicon germanium (i-pc-SiGe:H), hydrogenated intrinsic nanocrystalline silicon (i-nc-Si:H), hydrogenated intrinsic microcrystalline silicon (i-µc-Si:H) or hydrogenated intrinsic microcrystalline silicon germanium (i-µc-SiGe:H).

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art.

What is claimed is:

1. A method for manufacturing a tandem thin-film silicon solar cell, comprising:
    coating a first electrode layer on a substrate;
    removing a portion of the first electrode layer to form a first separation trench using a first patterning process, thereby forming a plurality of first electrodes;
    forming a first unit cell layer on the plurality of first electrodes and in the first separation trench, the first unit cell layer comprising a p-type window layer, an i-type absorber layer and an n-type layer;
    forming an intermediate reflection layer comprising a hydrogenated n-type microcrystalline silicon oxide of which an oxygen concentration is profiled to be gradually increased from the light incident side;
    forming a second unit cell layer on the intermediate reflection layer;
    removing portions of the first and second unit cell layers to form a second separation trench using a second patterning process;
    stacking a second electrode layer on the second unit cell layer and in the second separation trench formed using the second patterning process; and
    removing a portion of the second electrode layer to form a third separation trench using a third patterning process.

2. The method according to claim 1, wherein the intermediate reflection layer is formed by oxidizing the n-type layer of the first unit cell layer, and an oxygen source gas for forming the intermediate reflection layer comprises carbon dioxide or oxygen.

3. The method according to claim 1, wherein the intermediate reflection layer has a refractive index of around 2.0.

4. The method according to claim 1, wherein the intermediate reflection layer has a thickness of 10 to 100 nm.

5. The method according to claim 1, wherein the intermediate reflection layer has a specific resistivity of $10^2$ to $10^5$ Ωcm.

6. The method according to claim 1, wherein two or three unit cell layers are formed.

7. The method according to claim 1, wherein the intermediate reflection layer is formed on the first unit cell layer, and the n-type layer of the first unit cell layer has a thickness of 30 to 50 nm and comprises hydrogenated n-type microcrystalline silicon.

8. The method according to claim 1, wherein the intermediate reflection layer is formed by oxidizing the n-type layer of the first unit cell layer, and the n-type layer of the first unit cell layer has a thickness of 40 to 150 nm and comprises hydrogenated n-type microcrystalline silicon.

9. The method according to claim 1, wherein the intermediate reflection layer is formed on the n-type layer of the first unit cell layer, and the deposition temperature and deposition pressure for stacking the n-type layer of the first unit cell layer are maintained.

10. The method according to claim 9, wherein the n-type layer of the first unit cell layer and the intermediate reflection layer are formed in the same reaction chamber.

11. The method according to claim 1, wherein the intermediate reflection layer is formed on the first unit cell layer, and the pressure fraction of the oxygen source gas for forming the intermediate reflection layer is increased and then maintained constant, or the flow of the oxygen source gas is increased through multiple steps.

12. The method according to claim 1, wherein the intermediate reflection layer is formed by oxidizing the n-type layer of the first unit cell layer, and plasma for forming the n-type layer of the first unit cell layer is turned off, the oxygen source layer for forming the intermediate reflection layer is introduced, and the plasma is then turned on.

13. A method for manufacturing a tandem thin-film silicon solar cell, comprising:
    coating a first electrode layer on a substrate;
    removing a portion of the first electrode layer to form a first separation trench using a first patterning process, thereby forming a plurality of first electrodes;
    forming a first unit cell layer on the plurality of first electrodes and in the first separation trench;
    forming an intermediate reflection layer comprising a hydrogenated n-type microcrystalline silicon oxide of which an oxygen concentration is profiled to be gradually increased from the light incident side;
    forming a second unit cell layer on the intermediate reflection layer;
    removing portions of the first and second unit cell layers to form a second separation trench using a second patterning process;
    stacking a second electrode layer on the second unit cell layer and in the second separation trench formed using the second patterning process; and
    removing a portion of the second electrode layer to form a third separation trench using a third patterning process.

14. The method according to claim 13, wherein the first unit cell layer comprises a p-type window layer, an i-type absorber layer and an n-type layer.

* * * * *